US012648171B2

(12) United States Patent
Lemon et al.

(10) Patent No.: US 12,648,171 B2
(45) Date of Patent: Jun. 2, 2026

(54) WRAPAROUND GATE STRUCTURE

(71) Applicant: GlobalFoundries U.S. Inc., Malta, NY (US)

(72) Inventors: John L. Lemon, Selkirk, NY (US); Hong Yu, Clifton Park, NY (US); Haiting Wang, Clifton Park, NY (US); Hui Zhan, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 450 days.

(21) Appl. No.: 18/322,212

(22) Filed: May 23, 2023

(65) Prior Publication Data

US 2024/0395932 A1    Nov. 28, 2024

(51) Int. Cl.
| | |
|---|---|
| H10D 30/63 | (2025.01) |
| H10D 30/01 | (2025.01) |
| H10D 30/62 | (2025.01) |
| H10D 86/00 | (2025.01) |
| H10D 86/01 | (2025.01) |

(52) U.S. Cl.
CPC ......... *H10D 30/637* (2025.01); *H10D 30/024* (2025.01); *H10D 30/62* (2025.01); *H10D 86/011* (2025.01); *H10D 86/215* (2025.01)

(58) Field of Classification Search
CPC .............. H10D 30/637; H10D 30/673; H10D 30/6735; H10D 30/024; H10D 30/62; H10D 86/011; H10D 86/215; H10D 86/201; H01L 21/76224
See application file for complete search history.

(56) References Cited

U.S. PATENT DOCUMENTS

| | | | |
|---|---|---|---|
| 2021/0066476 A1* | 3/2021 | Kao ................. | H01L 21/76832 |
| 2024/0304704 A1* | 9/2024 | Lee ..................... | H10D 30/024 |

OTHER PUBLICATIONS

Doyle et al., "High Performance Fully-Depleted Tri-Gate CMOS Transistors", IEEE Electron Device Letters, vol. 24, No. 4, Apr. 2003, 3 pages.
Fahad et al., "Are Nanotube Architectures More Advantageous Than Nanowire Architectures For Field Effect Transistors?", Scientific Reports, Jun. 2012, 8 pages.
Jurczak et al., "Review of FINFET technology", 2009 IEEE International SOI Conference, Oct. 5-8, 2009, 4 pages.
Hayden et al., "Semiconductor nanowire devices", Science Direct, Oct.-Dec. 2008, vol. 3, Issue 5-6, 11 pages.
Planes et al., "28nm FDSOI technology platform for high-speed low-voltage digital applications", 2012 Symposium on VLSI Technology (VLSIT), Jun. 12-14, 2012, 2 pages.
Carter et al., "22nm FDSOI technology for emerging mobile, Internet-of-Things, and RF applications", 2016 IEEE International Electron Devices Meeting (IEDM), Dec. 3-7, 2016, 4 pages.

* cited by examiner

*Primary Examiner* — Nelson Garces
(74) *Attorney, Agent, or Firm* — Erica Ee; Andrew M. Calderon; Calderon Safran & Wright P.C.

(57) ABSTRACT

The present disclosure relates to semiconductor structures and, more particularly, to a wraparound gate structure and methods of manufacture. The structure includes: a channel region comprising semiconductor material; an isolation structure surrounding the channel region; a divot within the isolation structure; and a gate structure comprising gate material within the divot and surrounding the channel region.

20 Claims, 4 Drawing Sheets

WRAPAROUND GATE STRUCTURE

BACKGROUND

The present disclosure relates to semiconductor structures and, more particularly, to a wraparound gate structure and methods of manufacture.

A Field Effect Transistor (FET) is a three-terminal active semiconductor device, where an output current is controlled by an electric field generated by an input voltage. FETs are used in high power switching applications, amongst other applications.

FETs can exhibit leakage current which reduces its performance. Leakage current is the current that leaks between a drain and a source (D/S) when the device is OFF, i.e., Vgs is below the device threshold voltage. Leakage may increase with decreased channel length, and it also has an exponential variation with respect to temperature.

SUMMARY

In an aspect of the disclosure, a structure comprises: a channel region comprising semiconductor material; an isolation structure surrounding the channel region; a divot within the isolation structure; and a gate structure comprising gate material within the divot and surrounding the channel region.

In an aspect of the disclosure, a structure comprises: a channel region comprising semiconductor material; an isolation structure comprising sidewall material and fill material, the sidewall material being recessed such that the sidewall material comprises a height lower than the fill material; and a gate structure comprising gate material extending into the recess and which surrounds the channel region.

In an aspect of the disclosure, a method comprises: forming a channel region comprising semiconductor material; forming an isolation structure surrounding the channel region; forming a divot within the isolation structure; and forming a gate structure comprising gate material within the divot and surrounding the channel region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a wraparound gate structure and methods of manufacture. More specifically, the wraparound gate structure comprises a gate wrap structure in fully depleted semiconductor on insulator (FDSOI) technology. For example, the wraparound gate structure comprises gate material at a lateral edge of a channel region. Advantageously, the wraparound gate structures improve device performance by enhancing gate control and reducing leakage.

The gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the gate structures of the present disclosure have been adopted from integrated circuit (IC) technology. For example, the structures are built on wafers and are realized in films of material patterned by photolithographic processes on the top of a wafer. In particular, the fabrication of the gate structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
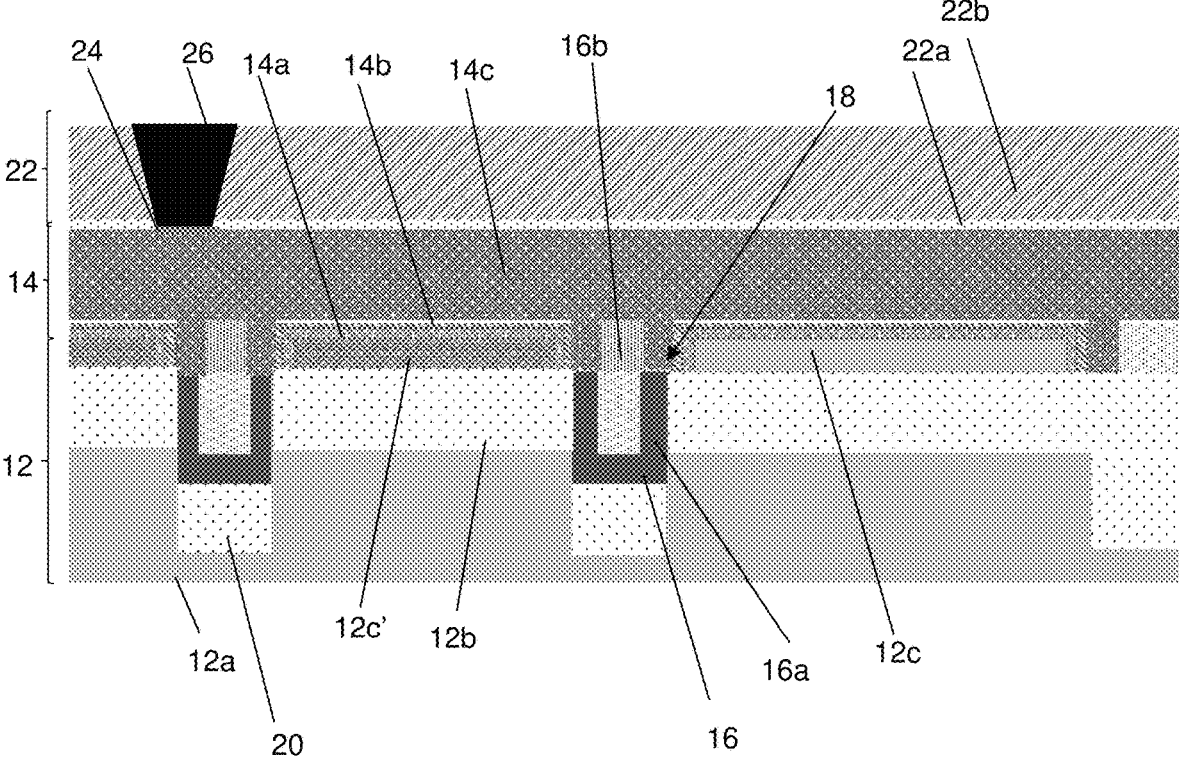
FIG. 1 shows a wraparound gate structure and respective fabrication processes in accordance with aspects of the present disclosure.

FIG. 1 shows a wraparound gate structure and respective fabrication processes in accordance with aspects of the present disclosure. The structure 10 of FIG. 1 includes gate structures 14 provided on a substrate 12. In embodiments, the gate structures 14 may be partly provided within a divot 18 formed from an etching process of an isolation structure 16 as described in more detail below. In this way, the gate structures 14 wrap around a channel region comprising semiconductor layer 12c, 12c' of the substrate 12. For example, the wrap around feature allows gate material 14a, 14b, 14c of the gate structures 14 to be laterally adjacent to the channel region and, in embodiments, may extend to at least a bottom surface of the channel region, e.g., to a buried insulator layer 12b of the substrate 12. This configuration affords increased gate control of the FET channel, which leads to lower leakage and a performance boost.

More specifically, the substrate 12 comprises FDSOI technology. The FDSOI technology comprises, from bottom to top, a handle wafer (e.g., semiconductor substrate) 12a, a buried insulator layer 12b and a top semiconductor layer 12c, 12c'. In embodiments, the top semiconductor layers 12c, 12c' comprises the channel region of the gate structures 14. The top semiconductor layers 12c, 12c' may be different materials depending on the type of gate structures, e.g., NFET or PFET. By way of non-limiting example, the semiconductor layer 12c may be fully depleted Si and the semiconductor layer 12c' may be fully depleted epitaxially grown SiGe.

The handle wafer 12a may include a semiconductor material such as, for example, Si, Ge, SiGe, SiC, SiGeC, III-V compound semiconductor, II-VI compound semiconductor or any combinations thereof. The handle wafer 12a provides mechanical support to the buried insulator layer 12b and the top semiconductor layers 12c, 12c'. The buried insulator layer 12b may include a dielectric material, e.g., SiN, $SiO_2Si_2N_2O$, boron nitride or a combination thereof. In one preferred embodiment, the buried insulator layer 12b comprises a buried oxide (BOX). The buried insulator layer 12b may be formed by a deposition process, e.g., chemical vapor deposition (CVD), plasma enhanced CVD (PECVD) or physical vapor deposition (PVD). In further embodiments, the buried insulator layer 12b may be formed using a thermal growth process, separation by implantation of oxygen (SIMOX) process, oxidation process or an oxygen implant process.

The top semiconductor layers 12c, 12c' may include any semiconductor material as mentioned above for the handle wafer 12a. In preferred embodiments, the top semiconductor layers 12c, 12c' comprise a fully depleted semiconductor material comprising a single crystallographic orientation, e.g., a (100), (110), (111), or (001) crystallographic orientation. The top semiconductor layers 12c, 12c' can be formed by a deposition process, e.g., CVD or PECVD or an epitaxial growth process as is known in the art such that no further explanation is required for a complete understanding of the present disclosure. Alternatively, the top semiconductor layers 12c, 12c' may be formed using a smart cut process where two semiconductor wafers are bonded together with an insulator in between.

Still referring to FIG. 1, the gate structures 14 comprise a gate dielectric material 14a, a workfunction metal 14b and polysilicon material 14c. In embodiments, the gate dielectric material 14a may be a high-k gate dielectric material, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 14a may be formed over the semiconductor layers 12c, 12c' and within the divot 18 at lateral ends of the channel region. The workfunction metal 14b may be formed over the dielectric material 14a, and may comprise any appropriate metal material for an NFET device or a PFET device. For example, the workfunction metal 14b may include Ti, TiAlC, Al, TiAl, TaN, TaAlC, TiN, TiC and Co, to name a few. The polysilicon material 14c may be formed over the workfunction metal 14b, and may be used as the gate electrode as is known in the art.

In embodiments, the gate dielectric material 14a, workfunction metal 14b and polysilicon material 14c may be provided in the divot 18 surrounding the channel region, e.g., semiconductor layers 12c, 12c'. More specifically, the gate dielectric material 14a, workfunction metal 14b and polysilicon material 14c may be laterally adjacent to the ends of the channel region (e.g., semiconductor layers 12c, 12c') and, in embodiments, may extend to at least a bottom surface of the channel region, e.g., to the buried insulator layer 12b of the substrate 12. In this way, the gate materials 14a, 14b, 14c will have an increased contact area with the channel region, which allows for greater channel control and reduced OFF state leakage.

The gate structures 14 can be fabricated using conventional CMOS processes. For example, the gate structures 14 can be fabricated using standard CMOS gate first processes. In the standard CMOS processing, the gate dielectric material 14a, workfunction metal 14b and polysilicon material 14c may be deposited on the top of semiconductor layers 12c, 12c' and within the divot 18 using conventional deposition processes, e.g., CVD, PVD, atomic layer deposition (ALD) or other suitable method. For example, the gate dielectric material 14a may be deposited by an ALD process; whereas the workfunction metal 14b and polysilicon material 14c may be deposited by a CVD process or PVD process.

Middle of the line materials 22 may be provide over the polysilicon material 14c. The middle of the line materials 22 may be, for example, a silicon oxide material 22a and SiN material 22b although other materials known in the art or combinations thereof are also contemplated herein. The middle of the line materials 22a, 22b may be formed by conventional deposition methods, e.g., CVD processes. An interconnect (e.g., contact) 26 may be formed to the gate structures 14 and source/drain features.

Although not critical to the understanding of the present invention, well implants, source/drain features, silicide contacts 24, interconnect structures (e.g., contacts) 26, etc., may be formed after the gate formation. In FIG. 1, for example, the source/drain features may be provided orthogonal (e.g., in the Y-axis) to the view shown in FIG. 1 (e.g., X-axis). The source/drain features and wells may be provided within the top semiconductor layers 12c, 12c'. The source/drain features may be formed by either an ion implantation process or an epitaxial growth process for raised source/drain features.

By way of example using the ion implantation process, the source/drain features and wells may be formed by introducing a concentration of a dopant in the top semiconductor layers 12c, 12c'. The wells and source/drain features may be formed by introducing a concentration of a different dopant of opposite conductivity type in the substrate. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. A P-well is doped with p-type dopants, e.g., Boron (B), and an N-well is doped with n-type dopants, e.g., Arsenic (As), Phosphorus (P) and Antimony (Sb), among other suitable examples.

Epitaxy processes may also be used to form the source/drain features. The epitaxy processes comprise selectively growing a semiconductor material on the semiconductor layers 12c, 12c'. In accordance with exemplary embodiments, epitaxy regions include silicon germanium or silicon. In accordance with alternative embodiments, epitaxy regions may include a III-V compound semiconductor such as GaAs, InP, GaN, InGaAs, InAlAs, GaSb, AlSb, AlAs, AlP, GaP, combinations thereof, or multi-layers thereof. Depending on whether the resulting gate structure is a p-type FET or an n-type FET, a p-type or an n-type impurity may be in-situ doped. For example, when the resulting FET is a p-type FET, silicon germanium boron (SiGeB) may be epitaxially grown; whereas, when the resulting FET is an n-type FET, silicon phosphorous (SiP) or silicon carbon phosphorous (SiCP) may be epitaxially grown. After the epitaxy step, epitaxy regions may be further implanted with a p-type or an n-type impurity to form source and drain regions. In accordance with alternative embodiments of the present disclosure, the implantation step is skipped when epitaxy regions are in-situ doped.

As should be understood by those of skill in the art, silicide contacts 24 may be formed to the source/drain features and gate electrode, e.g., polysilicon material 14c. The silicide contacts 24 may be formed on exposed underlying gate electrode (e.g., polysilicon material 14c) and source/drain features, through a trench within the middle of the line materials 22a, 22b.

The trench may be formed by conventional lithography and etching processes. For example, a resist formed over the middle of the line material 22b is exposed to energy (light) and developed to form a pattern (opening). An etching process with a selective chemistry, e.g., reactive ion etching (RIE), will be used to transfer the pattern to the middle of the line materials 22a, 22b to form one or more trenches in the middle of the line materials 22a, 22b through the openings of the resist. Following the resist removal by a conventional oxygen ashing process or other known striptants, the exposed features can be subjected to a silicide process.

The silicide process begins with deposition of a thin transition metal layer, e.g., nickel, cobalt or titanium, over fully formed and patterned semiconductor devices (e.g., doped or ion implanted source and drain regions and respective gate structures 14). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device.

Conductive material, e.g., contacts 26, may be deposited by any conventional deposition processes, e.g., CVD processes, on the silicide contacts 24. The conductive material may be, for example, tungsten with a TiN or TaN liner as non-limiting examples. Any residual material on the surface of the material 22b can be removed by conventional chemical mechanical polishing (CMP) processes.

FIG. 1 further shows two isolation structures 20, 16. As described in more detail with respect to FIGS. 2A-2E, the isolation structure 20 may be formed through the buried insulator layer 12b and top semiconductor layers 12c, 12c', extending into the handle wafer 12a. The isolation structure 20 may comprise a silicon oxide material. The isolation structure 16 may be in alignment with the isolation structure 20, extending into the handle wafer 12a; although other depths are contemplated herein. The divot 18 may be formed in the isolation structure 16, surrounding the top semiconductor layers 12c, 12c' (e.g., channel region).

The isolation structure 16 comprises a sidewall material 16a and fill material 16b. In embodiments, the sidewall material 16a may also be at a bottom of the isolation structure 16. The sidewall material 16a and the fill material 16b are both insulator materials with different etchant rates. For example, the sidewall material 16a may have a faster etch rate than the fill material 16b. As an example, the sidewall material 16a may have a lower density than the fill material 16. By way of more specific example, the sidewall material 16a may comprise silicon oxide formed by an ALD process, providing a higher etch rate, than the fill material 16b formed by a high thermal, flowable oxide process, high density plasma (HDP) oxide process or high aspect ratio process (HARP). In this way, through an etching process, it is possible to form the divot 18 by recessing the sidewall material 16a to a height that is lower than the fill material 16b. In embodiments, the sidewall material 16a and the fill material 16b may be on contact with the end gate portions, e.g., gate material within the divot 18. Also, in embodiments, the fill material 16b is narrower in dimension than the lower isolation structure 20.

Accordingly, as shown in FIG. 1, the gate structure 14 wraps around the channel region, e.g., semiconductor layers 12c, 12c' of the substrate 12. For example, the material of the gate structure 14 may be partly within a divot 18 formed from the isolation structure 16, which wraps around the channel region, e.g., semiconductor layers 12c, 12c'. Also, the gate structure 14 may extend to lateral sides (edges) of the channel region, e.g., semiconductor layers 12c, 12c'. In this way, the gate material has an increased contact area with the channel region, which provides greater channel control and reduced OFF state leakage. A silicide contact 24 and contact 26 extending through the middle of line materials 22 electrically connect to the gate structure 14, e.g., gate electrode (polysilicon material 14c). In embodiments, the contact 26 may be aligned with the isolation structure 16.

Figure 2A:
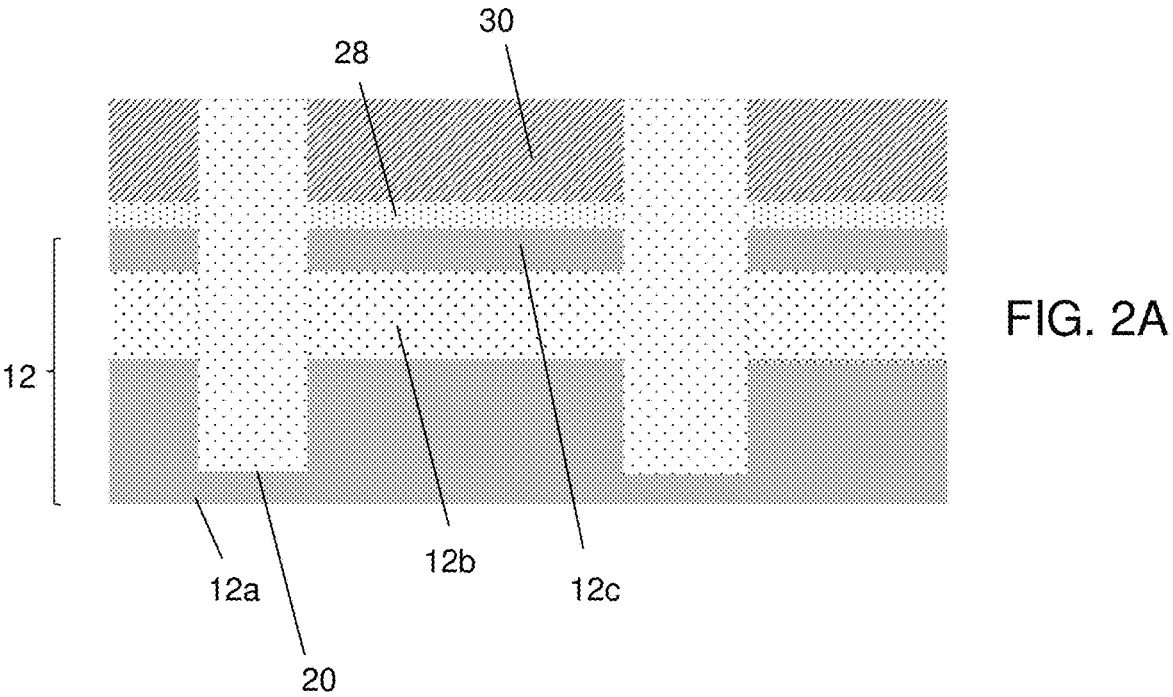
FIGS. 2A-2E show fabrication processes for manufacturing the structure of FIG. 1 in accordance with aspects of the present disclosure.

FIGS. 2A-2E show fabrication processes for manufacturing the structure of FIG. 1 in accordance with aspects of the present disclosure. In FIG. 2A, a deep trench isolation structure 20 is formed upon the substrate 12, in addition to a silicon oxide layer 28 and silicon nitride (SiN) layer 30. In embodiments, the deep trench isolation structure 20 is formed using conventional lithography, etching and deposition methods. For example, a resist formed over the SiN layer 30 is exposed to energy (light) and developed to form a pattern (opening). An etching process with a selective chemistry, e.g., RIE, will be used to transfer the pattern into the underlying materials to form one or more trenches through the openings of the resist. Following the resist removal by a conventional oxygen ashing process or other known stripants, insulator material can be deposited by, for example, flowable CVD processes. Any residual material on the surface of the SiN layer 30 can be removed by conventional CMP. The deep trench isolation structure 20 preferably extends into the handle wafer 12a.

Figure 2B:
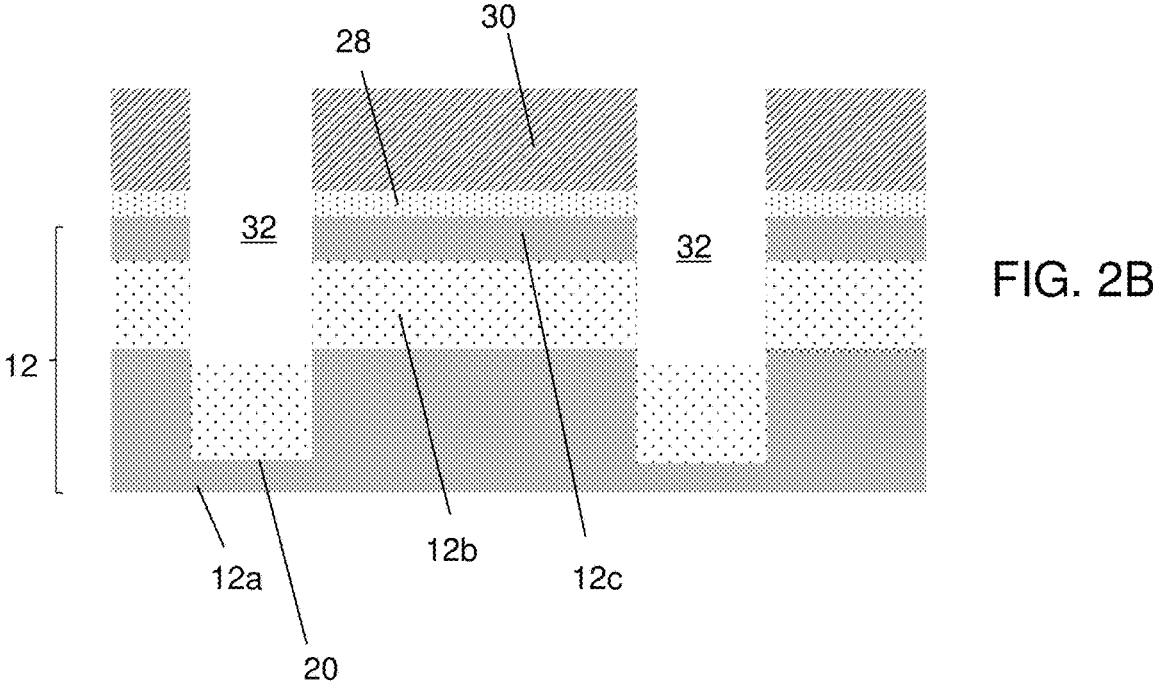

In FIG. 2B, a recess or trench 32 is formed by an etch back of the deep trench isolation structures 20. In embodiments, the deep trench isolation structures 20 may be etched back using a selective etching process. For example, the deep trench isolation structures 20 may be recessed using SiCoNi processes as is known in the art such that no further explanation is required for a complete understanding of the present disclosure.

Figure 2C:
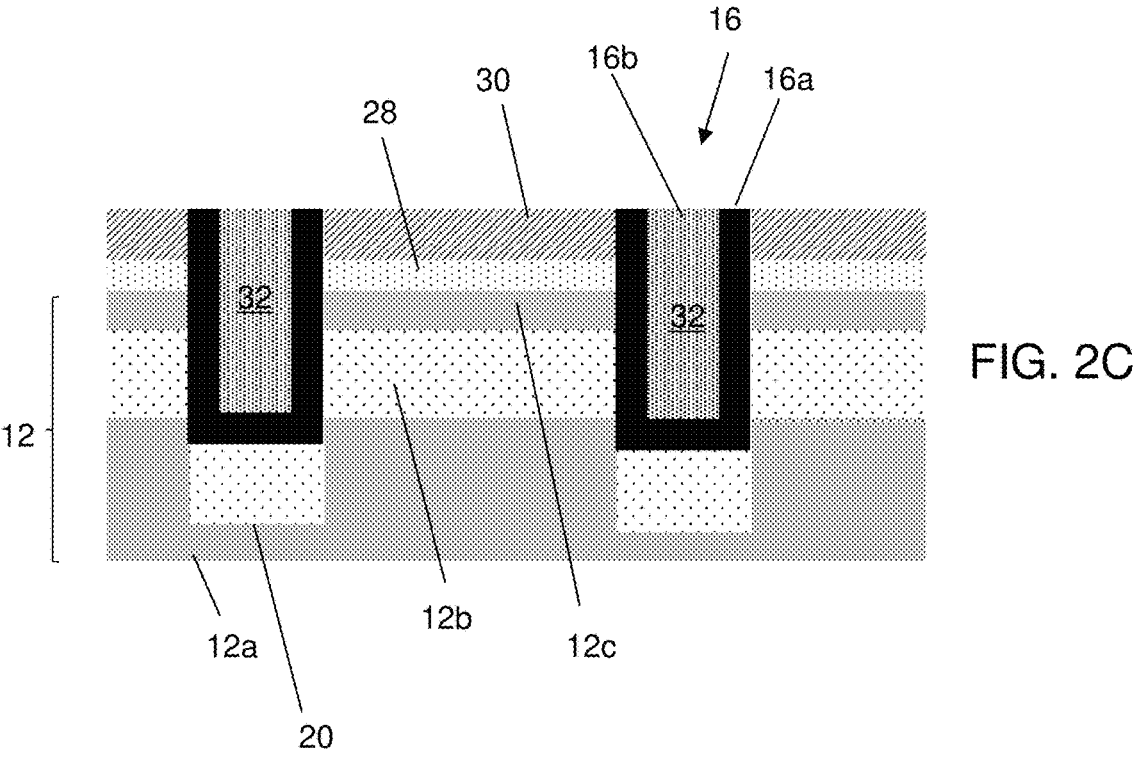

In FIG. 2C, the shallow trench isolation structures 16 are formed within the trenches 32. In embodiments, the shallow trench isolation structures 16 are formed by depositing sidewall material 16a and fill material 16b within the trench 32, followed by a CMP process. In embodiments, the sidewall material 16a may be deposited on the sidewalls and the bottom of the trench 32.

The sidewall material 16a and fill material 16b comprise different material properties, e.g., etch at different rates when subjected to a chemical etchant in subsequent fabrication steps. For example, the sidewall material 16a may have a lower density than the fill material 16b. This allows the sidewall material 16a to be etched at a faster rate than the fill material 16b to form the divot 18 as shown in FIG. 2E. In more specific embodiments, the sidewall material 16a may be a silicon oxide material that is deposited by an ALD process. In alternative embodiments, the sidewall material 16a may be other insulator materials, e.g., low-k dielectric material, etc., that has a different etch rate, e.g., faster, than the fill material 16b. The fill material 16b may be high density plasma oxide.

Figure 2D:
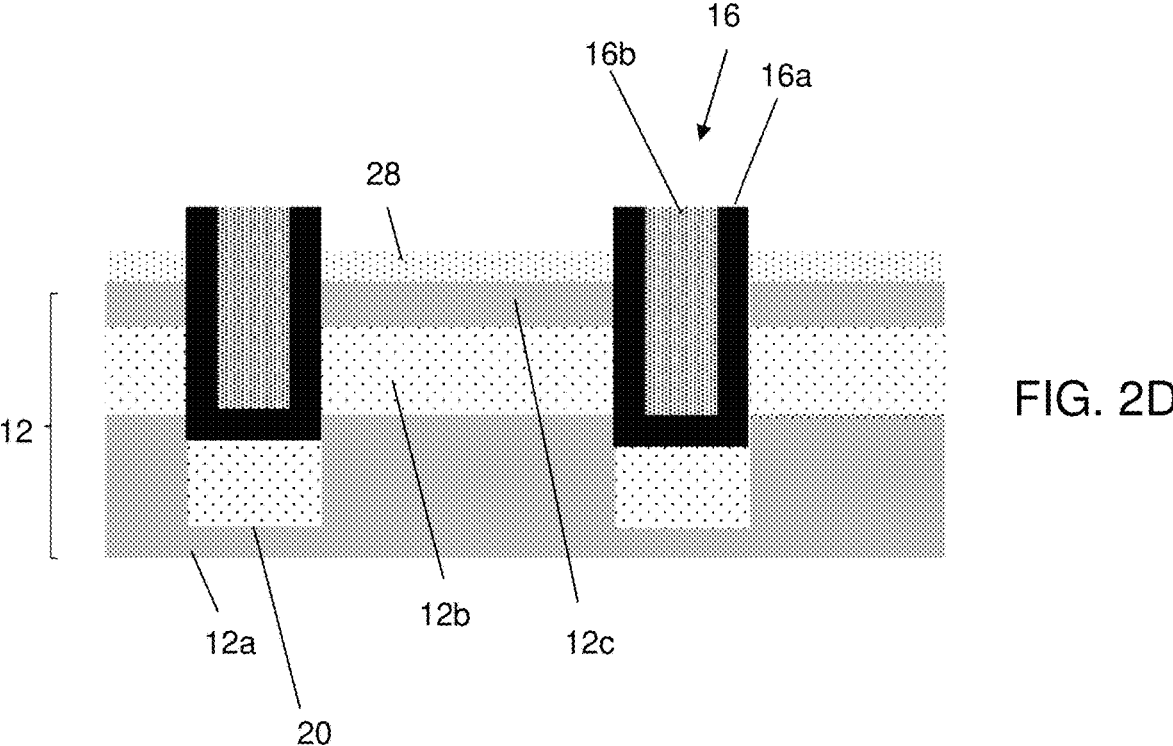
Figure 2E:
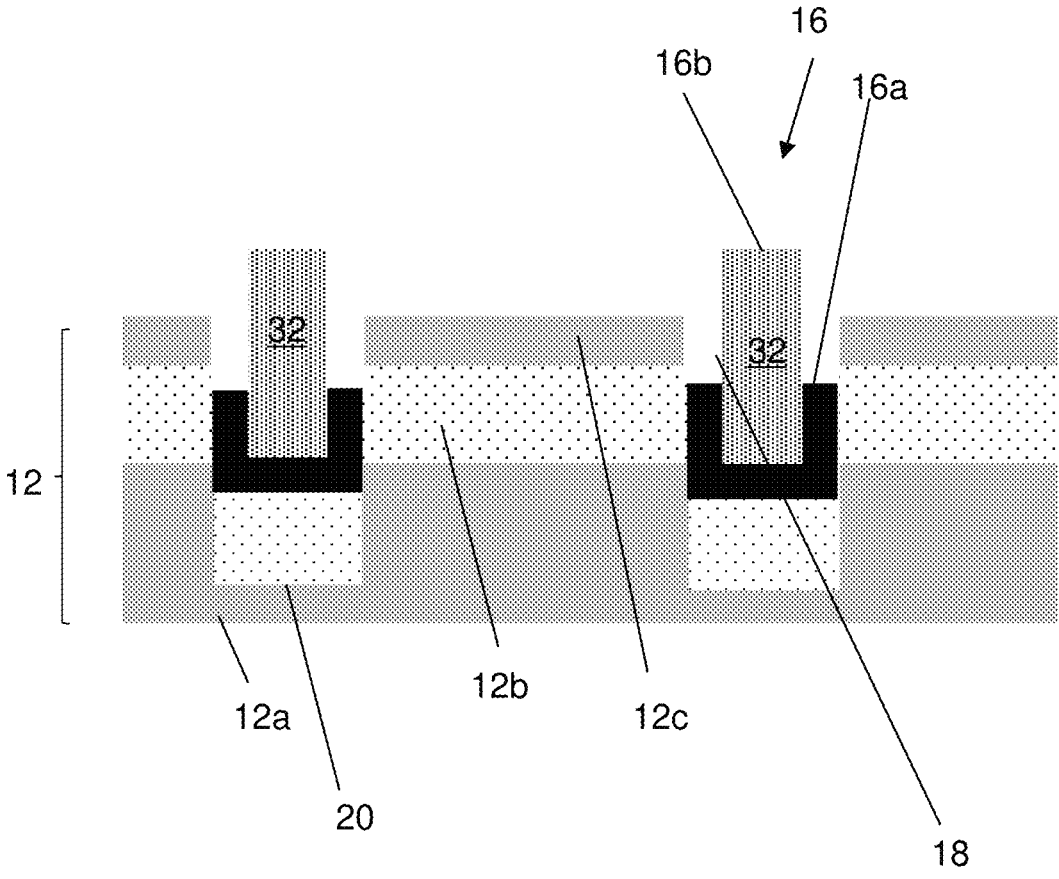

In FIG. 2D, the SiN material may be stripped (e.g., removed), leaving a raised shallow trench isolation structure 16. In embodiments, the SiN material may be stripped using a selective etching process, e.g., hot phosphoric acid.

In FIG. 2E, the silicon oxide layer 28 may be removed and the sidewall material 16a of the shallow trench isolation structures 16 recessed to form the divot 18 around the channel region, e.g., semiconductor layer 12c. In embodiments, the removal of the silicon oxide layer 28 and the recessing of the sidewall material 16a may be performed without any significant loss of height of the shallow trench isolation structures 16, e.g., without a loss of the fill material 16b. In embodiments, the sidewall material 16a may be removed by a selective etching process. For example, in embodiments, the sidewall material 16a may be removed by DHF and chemical oxide removal (COR) processes. In embodiments, a SiCoNi process may also be used to recess the sidewall material 16a.

Referring back to FIG. 1, the middle of the line processes are provided. For example, FIG. 1 shows the formation of the middle of the line materials 22, silicide contacts 24 and contacts 26. FIG. 1 further describes formation of well implants and source/drain features, e.g., diffusion regions, as is known in the art.

The gate structure can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a channel region comprising semiconductor material;
an isolation structure surrounding the channel region;
a divot within the isolation structure; and
a gate structure comprising gate material within the divot and surrounding the channel region,
wherein the channel region comprises fully depleted semiconductor on insulator material.

2. The structure of claim 1, wherein the divot extends to a buried insulator material under the semiconductor on insulator material.

3. The structure of claim 1, wherein the isolation structure comprises a sidewall material and a fill material with different material properties.

4. The structure of claim 3, wherein the sidewall material comprises a lower density than the fill material.

5. The structure of claim 4, wherein the sidewall material is recessed in relation to the fill material, and the divot is between the recessed sidewall material, the fill material and the semiconductor material of the channel region.

6. A structure comprising:
a channel region comprising semiconductor material;
an isolation structure surrounding the channel region;
a divot within the isolation structure;
a gate structure comprising gate material within the divot and surrounding the channel region; and
a deep isolation structure extending into a handle substrate under the semiconductor material and being in alignment with the isolation structure.

7. The structure of claim 1, wherein the gate material wraps around a lateral edge of the channel region.

8. The structure of claim 7, wherein the gate material is above the channel region.

9. The structure of claim 8, wherein the gate material comprises at least a gate dielectric material and a gate electrode.

10. A structure comprising:
a channel region comprising semiconductor material;
an isolation structure comprising sidewall material and fill material, the sidewall material being recessed such that the sidewall material comprises a height lower than the fill material; and
a gate structure comprising gate material extending into the recess and which surrounds the channel region; and
a deep isolation structure in alignment with the isolation structure.

11. The structure of claim 10, wherein the channel region comprises fully depleted semiconductor material.

12. The structure of claim 11, wherein the isolation structure extends to a buried insulator material under the channel region.

13. The structure of claim 10, wherein the sidewall material and the fill material have different material compositions.

14. The structure of claim 10, wherein ends of the gate material contact laterally around ends of the channel region.

15. The structure of claim 14, wherein the ends of the gate material contact the sidewall material and the fill material.

16. The structure of claim 14, wherein the gate material is over the channel region.

17. The structure of claim 10, wherein the sidewall material is on a bottom of the isolation structure.

18. The structure of claim 10, wherein the channel region comprises fully depleted semiconductor on insulator material.

19. The structure of claim 18, wherein the divot extends to a buried insulator material under the semiconductor on insulator material.

20. The structure of claim 6, wherein the isolation structure comprises a sidewall material and a fill material with different material properties.

* * * * *